United States Patent
Grosbach et al.

(10) Patent No.: US 7,567,137 B2
(45) Date of Patent: *Jul. 28, 2009

(54) PROGRAMMABLE OSCILLATORS FOR HIGH FREQUENCY CLOCK GENERATION FOR SIMULATION ENVIRONMENTS

(75) Inventors: Lyle Edwin Grosbach, Rochester, MN (US); Quentin Gustave Schmierer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 44 days.

This patent is subject to a terminal disclaimer.

(21) Appl. No.: 11/952,613

(22) Filed: Dec. 7, 2007

(65) Prior Publication Data

US 2008/0088380 A1    Apr. 17, 2008

Related U.S. Application Data

(63) Continuation of application No. 11/344,903, filed on Feb. 1, 2006, now Pat. No. 7,319,367.

(51) Int. Cl.
*G06F 17/50* (2006.01)
*H03B 27/00* (2006.01)

(52) U.S. Cl. .............................. 331/57; 703/13; 703/15
(58) Field of Classification Search ................... 331/57; 703/13, 15
See application file for complete search history.

(56) References Cited

U.S. PATENT DOCUMENTS

| 6,110,217 A | 8/2000 | Kazmierski et al. |
| 6,216,099 B1 | 4/2001 | Fang et al. |
| 2003/0204389 A1 | 10/2003 | Feldmann et al. |

*Primary Examiner*—Joseph Chang
(74) *Attorney, Agent, or Firm*—Joan Pennington

(57) ABSTRACT

A method and programmable oscillator model are provided for implementing high frequency clock generation for a simulation environment. The programmable oscillator model includes an internal ring oscillator for generating a high frequency clock. The internal ring oscillator counts a number of clocks and determines when to switch the reference clock. For example, a clock edge time is recorded as a two-byte field, where a high byte records a programmable number of fast clocks per clock edge, and a low byte records a fraction of a clock edge. Each time the reference clock switches a count down counter is loaded with the high byte, and the low byte is added to the current fraction. If the fraction has a carry, an additional fast clock is added to the count down counter.

8 Claims, 6 Drawing Sheets

PROGRAMMABLE OSCILLATORS FOR HIGH FREQUENCY CLOCK GENERATION FOR SIMULATION ENVIRONMENTS

This application is a continuation application of Ser. No. 11/344,903 filed on Feb. 1, 2006.

FIELD OF THE INVENTION

The present invention relates generally to the data processing field, and more particularly, relates to a method and programmable oscillator model for implementing high frequency clock generation for a simulation environment.

DESCRIPTION OF THE RELATED ART

System-on-Chip designs have several different reference oscillators. In a simulation environment, a need exists to control a desired number of reference clocks with high accuracy of frequency generation.

Previous implementations used hardware verification language (HVL) test code to generate and control the oscillators for simulations.

However, known HVL test code for generating and controlling oscillators lacks the required flexibility to effectively control the desired number of reference clocks with the accuracy needed.

A need exists for an efficient and effective mechanism for generating reference clocks and to create several clocks at different frequencies for simulators or verification test suites.

SUMMARY OF THE INVENTION

Principal aspects of the present invention are to provide a method and programmable oscillator model for implementing high frequency clock generation for a simulation environment. Other important aspects of the present invention are to provide such method and programmable oscillator model for implementing high frequency clock generation for a simulation environment substantially without negative effect and that overcome many of the disadvantages of prior art arrangements.

In brief, a method and programmable oscillator model are provided for implementing high frequency clock generation for a simulation environment. The programmable oscillator model includes an oscillator for counting a number of clocks and determines when to switch the reference clock.

In accordance with features of the invention, a clock edge time is recorded as a two-byte field, where a high byte records a programmable number of fast clocks per clock edge, and a low byte records a fraction of a clock edge. Each time the reference clock switches a count down counter is loaded with the high byte, and the low byte is added to the current fraction. If the fraction has a carry, an additional fast clock is added to the count down counter.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a simulation environment is enabled to control a desired number of reference clocks with high accuracy of frequency generation. Unique oscillators are modeled, and varied through specified frequency ranges to provide complete coverage on frequency ratios in a design. A small hardware description language (HDL) model generates the system clocks. The HDL model calculates the rise and fall times for the selected oscillator.

In accordance with features of the invention, an additional oscillator is added to the verification test bench. A hardware verification language (HVL) test or simulator HVL control program programs each of the oscillators at the beginning of simulation, and then does not need to keep track of the state of each oscillator during the simulation. This solution works well across event simulators, cycle simulators, and hardware accelerators with the HVL control program relieved from the generation of the reference clocks via the HDL model test bench of the preferred embodiment.

Figure 1:
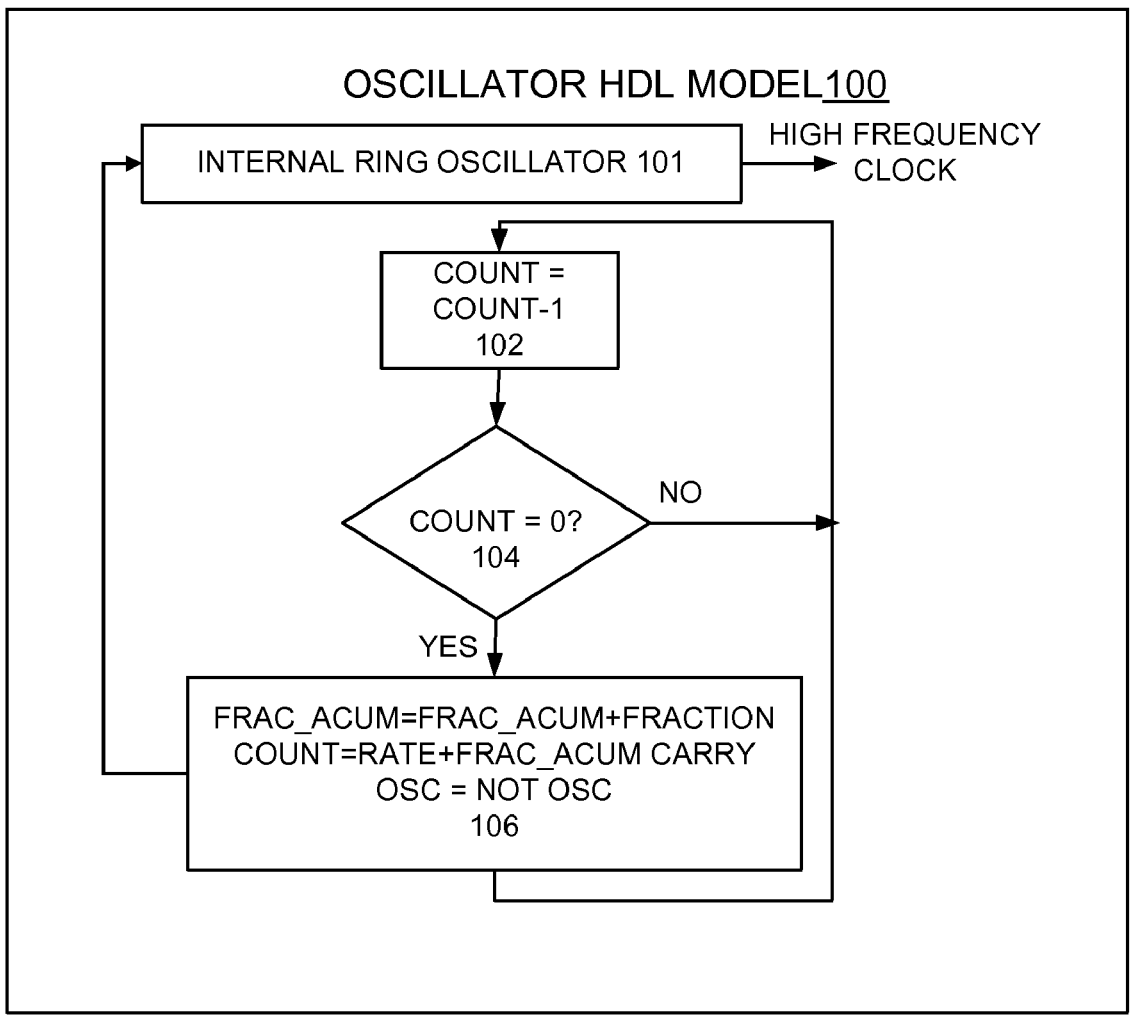
FIG. 1 is program flow illustrating an oscillator hardware description language (HDL) model in accordance with the preferred embodiment in accordance with the preferred embodiment.

Having reference now to the drawings, in FIG. 1, there is shown program flow illustrating an oscillator hardware description language (HDL) model generally designated by the reference character 100 in accordance with the preferred embodiment.

The oscillator hardware description language (HDL) model 100 has an internal ring oscillator 101 to generate a high frequency clock. The oscillator counts the number of clocks and determines when to switch the reference clock.

In a current implementation a clock edge time is recorded as a two-byte field, where a high byte records the number of fast clocks per clock edge, and a low byte records a fraction of a clock edge. Each time the reference clock switches a count down counter is loaded with the high byte, and the low byte is added to the current fraction. If the fraction has a carry, an additional fast clock is added to the count down counter. Initially the generated clock has a duty cycle that has jitter, but then averages at the programmed frequency.

A count is decremented by 1 as indicated in a block 102. Then the resulting count is compared with zero as indicated in a decision block 104. If the resulting count is not zero, then the count is decremented by 1 at block 102. When the resulting count is zero, then as indicated in a block 106, a fraction accumulator FRAC_ACUM and the count down COUNT are set as indicated by:

FRAC_ACUM=FRAC_ACUM+FRACTION

COUNT=RATE+FRAC_ACUM CARRY

OSC=NOT OSC

Then the sequential operations return to block 102, and the count is decremented by 1 and the sequential operations continue.

Figure 2:
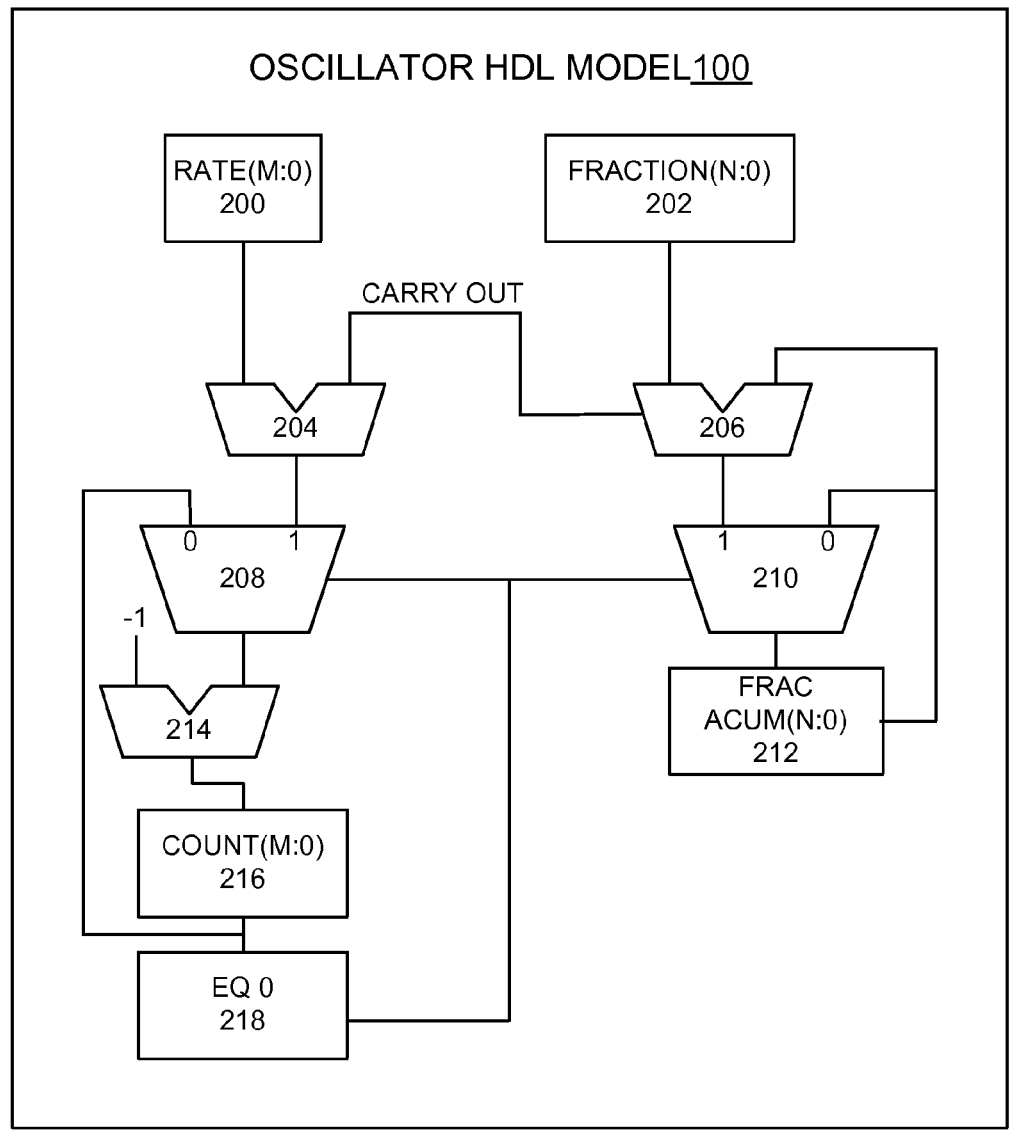
FIG. 2 is a schematic diagram illustrating a logic implementation of the oscillator hardware description language (HDL) model of FIG. 1 in accordance with the preferred embodiment.

Referring also to FIG. 2, there is shown an exemplary logic implementation of the oscillator hardware description language (HDL) model 100 in accordance with the preferred embodiment. HDL model 100 includes a reference clock register 200 receiving a high byte RATE(M:0) that records the number of fast clocks per clock edge, and a reference clock register 202 receiving a low byte FRACTION(N:0) that records a fraction of a clock edge. A respective adder 204, 206 is loaded by the respective reference clock register 200, RATE(M:0) and the respective reference clock register 202 RATE(M:0). The carry out of adder 206 is applied to the adder 204. An output of the respective adder 204, 206 is applied to an input 1 of a respective 2:1 multiplexer 208, 210. An output of the 2:1 multiplexer 210 is applied to a fraction accumulator 212 FRAC ACUM(N:0). An output of the 2:1 multiplexer 208 is applied to a count down counter defined by an adder 214 having a second input for decrementing by 1, and a register COUNT (M:0) 216. When the resulting count is zero, then EQ 0 218 applies a select input to multiplexers 208, 210 so that each time the reference clock switches the count down counter is loaded with the high byte applied to adder 204, and the low byte is added to the current fraction applied to adder 206. If the fraction has a carry, an additional fast clock is added to the count down counter with CARRY(N) applied to adder 204.

Figure 3:
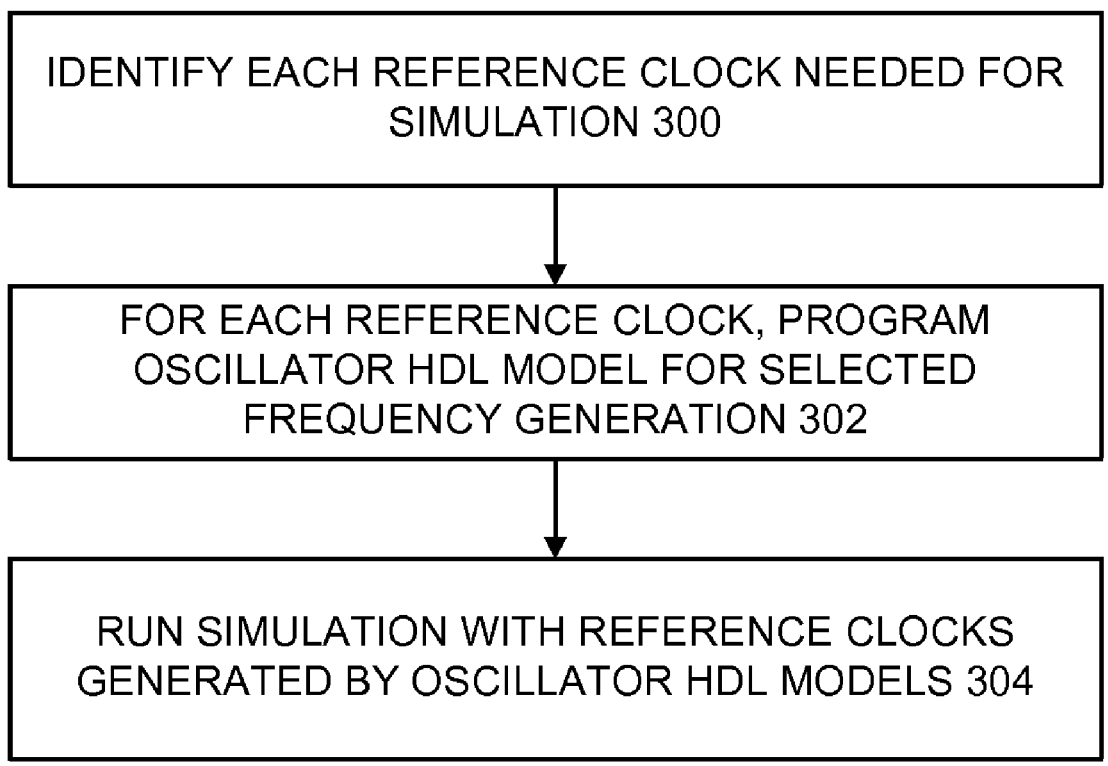
FIG. 3 is a flow chart illustrating exemplary steps for implementing simulations using the oscillator HDL model in accordance with the preferred embodiment.

Referring now to FIG. 3, there are shown exemplary steps for implementing simulations using the oscillator HDL model in accordance with the preferred embodiment. Each required reference clock for a simulation is identified as indicated in a block 300. For each required reference clock, an oscillator HDL model 100 is programmed to provide a selected frequency generation as indicated in a block 302. Then the simulation runs with the required reference clocks being generated by the programmed oscillator HDL models 100 as indicated in a block 304.

Various simulations can be implemented using the programmed oscillator HDL model, such as event simulators, cycle simulators, and hardware accelerators. A simulator HVL control program programs each of the oscillators at the beginning of simulation, for example, at block 302, and then runs the simulation at block 304 without being required to keep track of the state of each programmed oscillator HDL model in accordance with the preferred embodiment.

Figure 4:
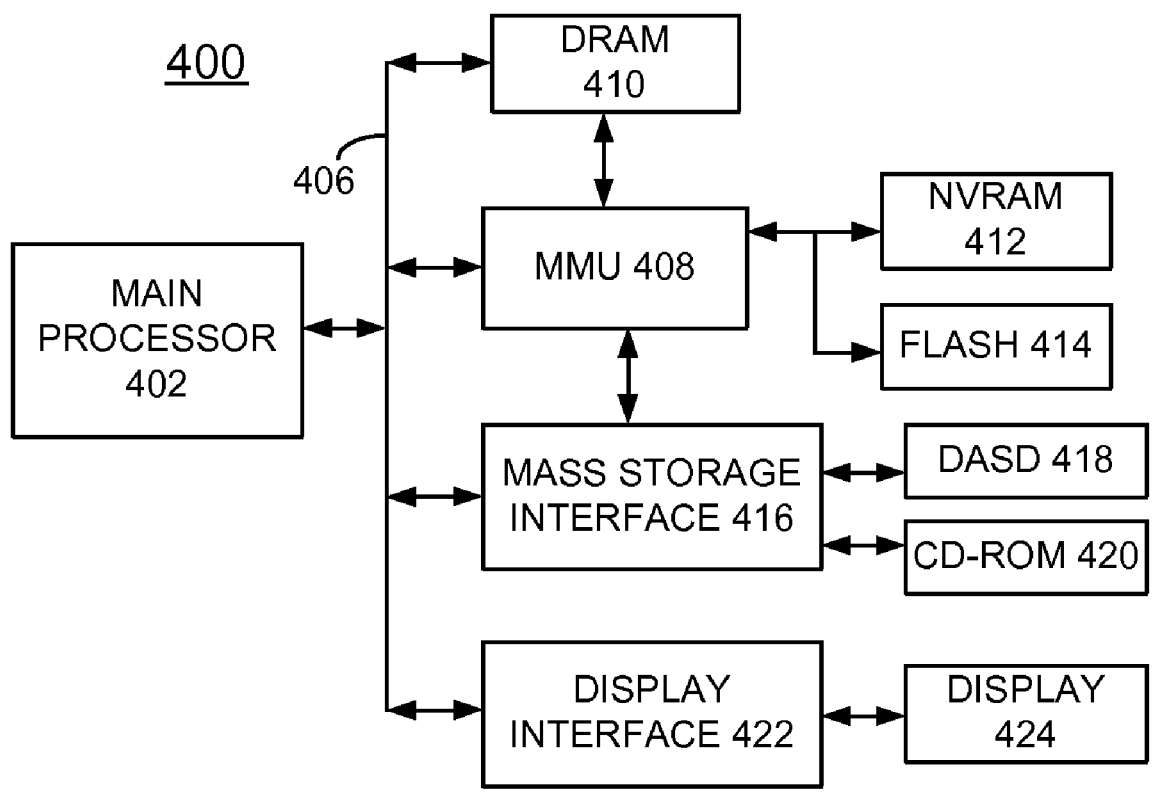
FIGS. 4 and 5 are block diagram representations illustrating an exemplary computer system and operating system for implementing the oscillator HDL model of FIGS. 1 and 2 and simulations using the oscillator HDL model in accordance with the preferred embodiment.
Figure 5:
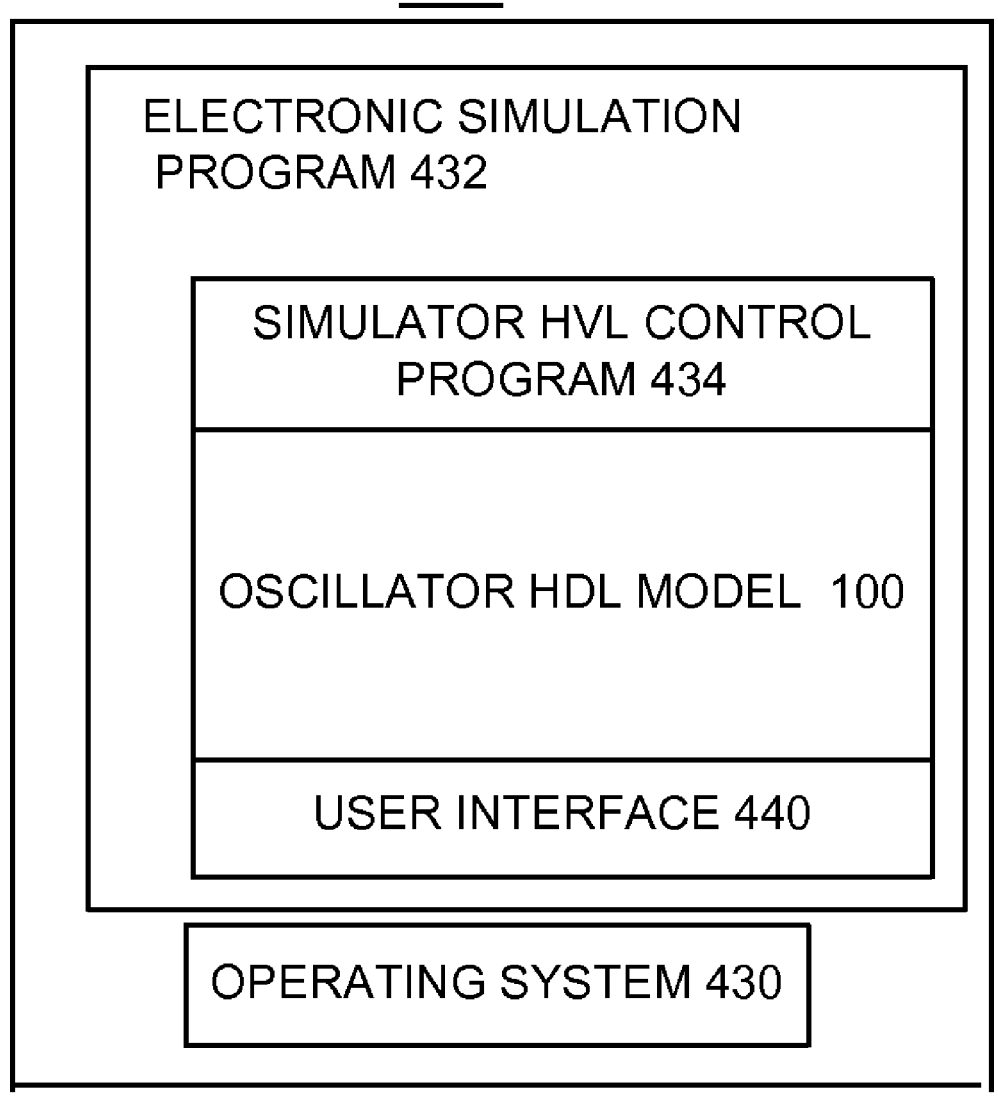

Referring now to the drawings, in FIGS. 4 and 5 there is shown a computer system generally designated by the reference character 400 for implementing oscillator HDL model 100 in accordance with the preferred embodiment and performing simulations using the oscillator HDL model in accordance with the preferred embodiment. Computer system 400 includes a main processor 402 or central processor unit (CPU) 402 coupled by a system bus 406 to a memory management unit (MMU) 408 and system memory including a dynamic random access memory (DRAM) 410, a nonvolatile random access memory (NVRAM) 412, and a flash memory 414. A mass storage interface 416 coupled to the system bus 406 and MMU 408 connects a direct access storage device (DASD) 418 and a CD-ROM drive 420 to the main processor 402. Computer system 400 includes a display interface 422 coupled to the system bus 406 and connected to a display 424.

Computer system 400 is shown in simplified form sufficient for understanding the present invention. The illustrated computer system 400 is not intended to imply architectural or functional limitations. The present invention can be used with various hardware implementations and systems and various other internal hardware devices, for example, multiple main processors.

As shown in FIG. 5, computer system 400 includes an operating system 430, an electronic simulation program 432, a simulator HVL control program 434, an oscillator HDL model 100 of the preferred embodiment, and a user interface 440. The oscillator HDL model 100 is incorporated into HDL test bench of the electronic simulation program 432 and used by the simulator HVL control program 434 during simulation execution.

Figure 6:
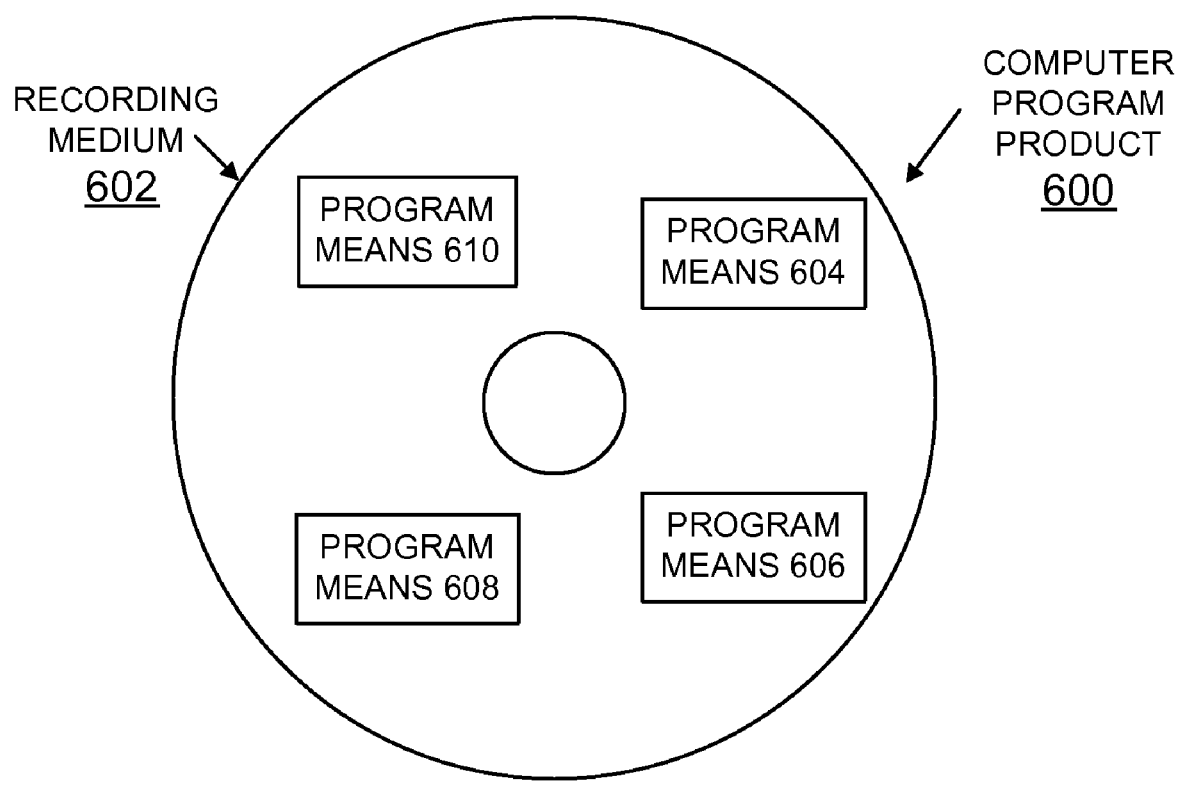
FIG. 6 is a block diagram illustrating a computer program product in accordance with the preferred embodiment.

Referring now to FIG. 6, an article of manufacture or a computer program product 600 of the invention is illustrated. The computer program product 600 includes a recording medium 602, such as, a floppy disk, a high capacity read only memory in the form of an optically read compact disk or CD-ROM, a tape, a transmission type media such as a digital or analog communications link, or a similar computer program product. Recording medium 602 stores program means 604, 606, 608, 610 on the medium 602 for carrying out the methods for implementing oscillator HDL model 100 in accordance with the preferred embodiment and performing simulations using the oscillator HDL model in accordance with the preferred embodiment in the system 400 of FIGS. 4 and 5.

A sequence of program instructions or a logical assembly of one or more interrelated modules defined by the recorded program means 604, 606, 608, 610, direct the computer system 400 for implementing oscillator HDL model 100 and performing simulations using the oscillator HDL model of the preferred embodiment.

While the present invention has been described with reference to the details of the embodiments of the invention shown in the drawing, these details are not intended to limit the scope of the invention as claimed in the appended claims.

What is claimed is:

1. A computer-readable medium encoded with a computer program product for implementing high frequency clock generation for a simulation in a computer system, said computer-readable medium consisting one of a floppy disk, a high capacity read only memory in the form of an optically read compact disk or CD-ROM, and a tape, said computer program product including instructions stored on said computer-readable medium and executed by the computer system to cause the computer system to perform the steps comprising:
    defining a programmable oscillator model including an internal ring oscillator for generating a high frequency clock;
    programming the internal ring oscillator for the simulation for counting a set number of clocks and for determining when to switch the reference clock; and
    generating the high frequency clock with the programmed internal ring oscillator during the simulation.

2. A computer-readable medium encoded with a computer program product for implementing high frequency clock generation as recited in claim 1 wherein the step of defining a programmable oscillator model including an internal ring oscillator for generating a high frequency clock includes storing an oscillator hardware description language (HDL) model.

3. A computer-readable medium encoded with a computer program product for implementing high frequency clock generation as recited in claim 1 wherein the step of defining a programmable oscillator model including an internal ring oscillator for generating a high frequency clock includes programming the internal ring oscillator for the simulation includes using a simulator hardware verification language (HVL) control program for programming the stored oscillator HDL model.

4. Apparatus for implementing high frequency clock generation for a simulation comprising:

a programmable oscillator hardware description language (HDL) model including an internal ring oscillator for generating a high frequency clock;

a simulator hardware verification language (HVL) control program for programming the stored oscillator HDL model for the simulation for counting a set number of clocks and for determining when to switch the reference clock; and said programmable oscillator HDL model for generating the high frequency clock with the programmed internal ring oscillator during the simulation.

5. Apparatus for implementing high frequency clock generation as recited in claim 4 wherein said programmable oscillator HDL model including said internal ring oscillator for generating a high frequency clock includes a clock edge time being recorded as a two-byte field, where a high byte records a programmable number of fast clocks per clock edge, and a low byte records a fraction of a clock edge.

6. Apparatus for implementing high frequency clock generation as recited in claim 5 includes a count down counter being loaded with the high byte each time the reference clock switches.

7. Apparatus for implementing high frequency clock generation as recited in claim 6 includes an adder for adding the low byte is added to a current fraction each time the reference clock switches.

8. Apparatus for implementing high frequency clock generation as recited in claim 6 wherein includes an additional fast clock is added to the count down counter when the fraction has a carry.

* * * * *